(12) United States Patent
Ljungblad et al.

(10) Patent No.: US 9,064,671 B2
(45) Date of Patent: Jun. 23, 2015

(54) METHOD AND APPARATUS FOR GENERATING ELECTRON BEAMS

(71) Applicant: Arcam AB, Moelndal (SE)

(72) Inventors: Ulric Ljungblad, Moelndal (SE); Mattias Svensson, Goeteborg (SE)

(73) Assignee: Arcam AB, Moelndal (SE)

( * ) Notice: Subject to any disclaimer, the term of this patent is extended or adjusted under 35 U.S.C. 154(b) by 324 days.

(21) Appl. No.: 13/828,112

(22) Filed: Mar. 14, 2013

(65) Prior Publication Data

US 2013/0300286 A1    Nov. 14, 2013

Related U.S. Application Data

(60) Provisional application No. 61/644,513, filed on May 9, 2012.

(51) Int. Cl.
| | |
|---|---|
| *H05H 1/54* | (2006.01) |
| *H01J 29/52* | (2006.01) |
| *B29C 67/00* | (2006.01) |
| *H01J 37/077* | (2006.01) |
| *H01J 37/305* | (2006.01) |
| *H01J 37/317* | (2006.01) |

(52) U.S. Cl.
CPC .............. *H01J 29/52* (2013.01); *B29C 67/0077* (2013.01); *H01J 37/077* (2013.01); *H01J 37/305* (2013.01); *H01J 37/3178* (2013.01); *H01J 2237/043* (2013.01); *H01J 2237/3128* (2013.01); *H01J 2237/31732* (2013.01)

(58) Field of Classification Search
USPC ...................................... 315/30–75
See application file for complete search history.

(56) References Cited

U.S. PATENT DOCUMENTS 5,198,718 A * 3/1993 Davis et al. ................. 313/359.1
5,241,243 A * 8/1993 Cirri ........................ 315/111.21
(Continued)

FOREIGN PATENT DOCUMENTS

EP           880161 A1    11/1998
JP      2011-204369 A    10/2011

OTHER PUBLICATIONS

International Searching Authority, International Search Report for International Application No. PCT/EP2013/058652, Nov. 4, 2013, 8 pages, European Patent Office, The Netherlands.
(Continued)

*Primary Examiner* — Brandon S Cole
(74) *Attorney, Agent, or Firm* — Alston & Bird LLP

(57) ABSTRACT

Various embodiments of the present invention relate to a plasma electron source apparatus. The apparatus comprises a cathode discharge chamber in which a plasma is generated, an exit hole provided in said cathode discharge chamber from which electrons from the plasma are extracted by an accelerating field provided between said cathode discharge chamber and an anode, at least one plasma confinement device, and a switching mechanism for switching the at least one plasma confinement device between a first value allowing for electron extraction from the plasma and a second value prohibiting electron extraction from the plasma. Associated methods are also provided.

28 Claims, 9 Drawing Sheets

(56) References Cited

U.S. PATENT DOCUMENTS

| | | | |
|---|---|---|---|
| 7,812,329 B2* | 10/2010 | Bykanov et al. | 250/504 R |
| 2002/0101159 A1 | 8/2002 | Closs et al. | |
| 2004/0026807 A1 | 2/2004 | Andersson et al. | |
| 2005/0205800 A1 | 9/2005 | Barnard et al. | |
| 2009/0066212 A1 | 3/2009 | Matacotta | |
| 2009/0152771 A1 | 6/2009 | Philippi et al. | |
| 2011/0080093 A1* | 4/2011 | Walton et al. | 315/111.21 |
| 2012/0100031 A1 | 4/2012 | Ljungblad | |
| 2013/0300286 A1* | 11/2013 | Ljungblad et al. | 315/30 |

OTHER PUBLICATIONS

Jiang, Q. D., et al., "Deposition of $YBa_2Cu_3O_{7-x}$ thin films by Channel-Spark Pulsed Electron Beam Ablation", Thin Solid Films, Apr. 1, 1994, pp. 100-102, vol. 241, No. 1-2, Switzerland.

Database WPI Week 201168 Thomson Scientific, London, GB; JP 2011 204369 A (Nichiden Anelva KK) Oct. 13, 2011, retreived from <http://www.thomsoninnovation.com/tip-innovation/printRecView.do?Resu . . .> on Apr. 30, 2014. (Thomson Innovation Record View of JP2011-204369A).

* cited by examiner

METHOD AND APPARATUS FOR GENERATING ELECTRON BEAMS

CROSS-REFERENCE TO RELATED APPLICATIONS

This application claims priority to and the benefit of U.S. Provisional Application Ser. No. 61/644,513, filed May 9, 2012, the contents of which are hereby incorporated by reference in its entirety.

BACKGROUND

1. Field of the Invention

Various embodiments of the present invention relate to a plasma electron source apparatus, a method for generating pulsed electron beams and the use of a plasma electron source apparatus.

2. Description of Related Art

Freeform fabrication or additive manufacturing is a method for forming three-dimensional articles through successive fusion of chosen parts of powder layers applied to a worktable. A method and apparatus according to this technique is disclosed in US Patent Application Publication No. 2009/0152771.

Such an apparatus may comprise a work table on which the three-dimensional article is to be formed, a powder dispenser, arranged to lay down a thin layer of powder on the work table for the formation of a powder bed, a ray gun for delivering energy to the powder whereby fusion of the powder takes place, elements for control of the ray given off by the ray gun over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

When using an electron beam for delivering energy to the powder in additive manufacturing it is desirable to switch on and off the electron beam relatively fast in order to control the heat distribution and the fusion mechanism.

The switching frequency is limited by the temperature time constant for the filament material when an electron beam is generated from a heated metal filament. It is difficult for not saying impossible to switch the electron generation from a hot filament on and off faster than 50 Hz.

The switching frequency of hot filament electron generation may be increased by using a so called triod design. In the triod design a grid is used, which rapidly may switch on and off the electron beam. However, with a triod design it may be difficult to form a usable electron beam for freeform fabrication with good quality with respect to focus and intensity stability over space and time and for variable current.

When an electron beam is generated from a plasma source the switching frequency is limited by the time for creating a plasma and extinguish a plasma. It is also limited by the switching time for the high voltage needed for turning on and off the plasma. The highest possible plasma generating frequency is in theory about 10 MHz, but in practice limited by the switching time of the high voltage drive electronics.

The known methods for creating pulsed electron beams do not have a sufficiently high pulse rate without influencing electron beam quality, which may be a problem in additive manufacturing.

BRIEF SUMMARY

Having this background, an object of the invention is to provide a method and apparatus which enables faster pulsing of an electron beam than is known in the prior art. The above-mentioned object is achieved by the features according to the claims contained herein.

According to various embodiments, a plasma electron source apparatus is provided. The apparatus comprises: a cathode discharge chamber in which a plasma is generated; an exit hole provided in the cathode discharge chamber from which electrons from the plasma are extracted by an accelerating field provided between the cathode discharge chamber and an anode; at least one plasma confinement device; and a switching mechanism for switching the at least one plasma confinement device between a first value allowing for electron extraction from the plasma and a second value prohibiting electron extraction from the plasma.

According to various embodiments, a method for generating a pulsed electron beam is also provided. The method comprises the steps of: generating a plasma in a cathode discharge chamber; extracting electrons from an exit hole in the cathode discharge chamber by an accelerated field provided between the cathode discharge chamber and an anode; providing at least one plasma confinement device; and switching the at least one plasma confinement device between a first value allowing for electron extraction from the plasma and a second value prohibiting electron extraction from the plasma.

According to various embodiments an alternative plasma electron source apparatus is also provided. The apparatus comprises: a cathode discharge chamber in which a plasma is generated, an exit hole 120 provided in the cathode discharge chamber 100 from which electrons from the plasma 107 are extracted by an accelerating field provided between the cathode discharge chamber 100 and an anode 104, at least one means for plasma confinement within the cathode discharge chamber 100, a switching means for switching the at least one means for plasma confinement between a first value allowing for electron extraction from the plasma 107 and a second value prohibiting electron extraction from the plasma 107.

The at least one means for plasma confinement within the cathode discharge chamber may be at least one electromagnetic coil, at least one electromagnetic wave generator and/or at least one beam controlling plate (125).

A parameter for regulating a confining force on the plasma between the first and second value may be: a current through a coil, where the coil is provided inside or outside the cathode discharge chamber; and/or a voltage on a plate, where the plate is arranged inside the cathode discharge chamber; and/or a wavelength or amplitude of an electromagnetic wave generated by an electromagnetic wave source provided inside or outside the cathode discharge chamber.

In certain embodiments, such parameters comprise means for plasma confinement within the cathode discharge chamber. By providing the means for plasma confinement within the cathode discharge chamber and switching the means between a confining and a non-confining state for achieving pulsed electron beam will give a fast control of the pulsed electron beam.

The at least one means for plasma confinement may be arranged inside and/or outside the cathode discharge chamber (100). By arranging the means for plasma confinement inside the cathode discharge chamber may affect the resonance frequency of the chamber but it is a compact solution. By arranging the means for plasma confinement outside the cathode discharge chamber is a more inexpensive and sometimes more efficient solution compared to having a similar means inside the cathode discharge chamber. The arrangement may also depend on the nature of the means for plasma confinement.

In various embodiments, a control unit for varying the duty cycle of the first value of the current through the at least one means for plasma confinement for varying the average electron current from the plasma electron source is provided.

The advantage of this embodiment is that it provides an easy control of beam power without interfering with the beam quality, i.e., good focus and intensity stability over space and time. The varying of the duty cycle of the first value of the plasma confinement provides for a very efficient means for beam power adjustment. The beam power may be switched between two different power levels in the order of as fast as the control mechanism may change the duty cycle of the first value of the current through the at least one means for plasma confinement. The plasma may be created, destroyed and/or reshaped very quickly.

In various embodiments, an electromagnetic wave source is provided for emitting electromagnetic wave power acting on the gas inside the cathode discharge chamber for producing the plasma. In an example embodiment the electromagnetic wave power is RF-power. In another example embodiment the electromagnetic wave power is microwave power. The plasma may be created or destroyed by changing the wavelength of the wave power to be out of resonance frequency for the plasma. The resonance frequency may depend on the type of molecules in the plasma and the size and shape of the cathode discharge chamber.

The advantage of such embodiments is that the plasma generation is separate and independent from the switching coil. Another advantage is that the electromagnetic wave source is an effective means for plasma generation.

In still other exemplary embodiments, the cathode discharge chamber is provided with an inlet connectable to a gas source for introducing gas into the cathode discharge chamber. The advantage of such embodiments is that the lifetime of the electron source is as long as there is supply of gas into the cathode discharge chamber.

In still other exemplary embodiments a frequency of switching between the first and second current values is higher than 100 Hz, 1 kHz or 100 kHz. The advantage of such embodiments is that the switching time is faster than the melting time constant.

In still other exemplary embodiments, at least one electron beam controlling plate 125 provided inside the cathode discharge chamber 100 and arranged so that at least a part of the plasma is provided between the electron beam controlling plate 125 and the exit hole 120. An advantage of such embodiments is that it provides for additional control of electron emission. Another advantage of the embodiment is that it provides for increased beam power. Still another advantage is that the electron beam leakage through the exit hole may be completely reduced. Still another advantage is that the at least one electron beam controlling plate is an effective means for plasma generation.

In still other exemplary embodiments, the electromagnetic coil 103 is substituted by at least one electron beam controlling plate 125 provided inside the cathode discharge chamber 100 and arranged so that at least a part of the plasma is provided between the electron beam controlling plate 125 and the exit hole 120. An advantage of such embodiments is that it is simpler than with a coil for forcing the electron through the exit hole.

In another aspect of various embodiments, a plasma electron source apparatus according to the present invention may be used for forming a three dimensional article through successive fusion of parts of at least one layer of a powder bed provided on a work table, which parts correspond to successive cross sections of the three-dimensional article.

In still other embodiments, a method is provided for generating a pulsed electron beam comprising the steps of: generating a plasma in a cathode discharge chamber, extracting electrons from an exit hole in the cathode discharge chamber by an accelerated field provided between the cathode discharge chamber and an anode, providing at least one means for plasma confinement within the cathode discharge chamber, switching the at least one means for plasma confinement between a first value allowing for electron extraction from the plasma and a second value prohibiting electron extraction from the plasma.

The method has similar advantages as its corresponding apparatus.

BRIEF DESCRIPTION OF THE SEVERAL VIEWS OF THE DRAWING(S)

The invention will be further described in the following, in a non-limiting way with reference to the accompanying drawings. Same characters of reference are employed to indicate corresponding similar parts throughout the several figures of the drawings.

DETAILED DESCRIPTION OF VARIOUS EMBODIMENTS

Various embodiments will now be described more fully hereinafter with reference to the accompanying drawings, in which some, but not all embodiments of the inventions are shown. Indeed, the various embodiments of the present invention may be embodied in many different forms and should not be construed as limited to the embodiments set forth herein; rather, these embodiments are provided so that this disclosure will satisfy applicable legal requirements.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g. of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

Figure 3:
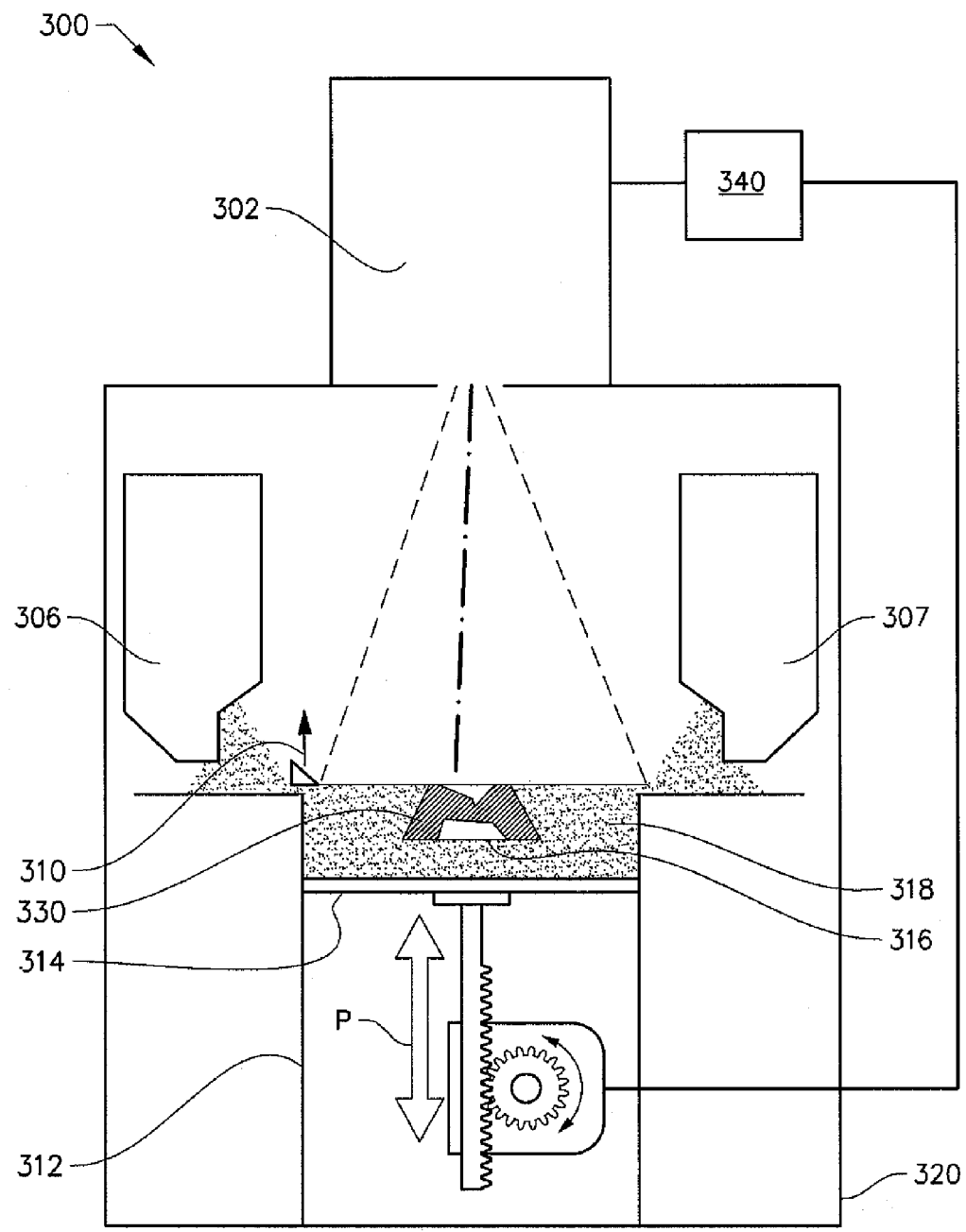
FIG. 3 depicts an example embodiment of a freeform fabrication or additive manufacturing apparatus in which the present inventive plasma electron source apparatus may be implemented.

FIG. 3 depicts an embodiment of a freeform fabrication or additive manufacturing apparatus 300 in which the present inventive plasma electron source apparatus may be implemented. The apparatus 300 comprising an electron gun 302; two powder hoppers 306, 307; a start plate 316; a build tank 312; a powder distributor 310; a build platform 314; and a vacuum chamber 320.

The vacuum chamber 320 is capable of maintaining a vacuum environment by means of a vacuum system, which system may comprise a turbo-molecular pump, a scroll pump, an ion pump and one or more valves which are well known to a skilled person in the art and therefore need no further explanation in this context. The vacuum system is controlled by a control unit.

The electron gun 302 is generating an electron beam which is used for melting or fusing together powder material 318 provided on the start plate 316. At least a portion of the electron gun 302 may be provided in the vacuum chamber 320. A control unit 340 may be used for controlling and managing the electron beam emitted from the electron beam gun 302. At least one focusing coil (not shown), at least one deflection coil and electron beam generating means may be electrically connected to the control unit 340. In an example embodiment of the invention the electron gun generates a focusable electron beam with an accelerating voltage of about 60 kV and with a beam power in the range of 0-3 kW. The pressure in the vacuum chamber may be in the range of $10^{-3}$-$10^{-6}$ mBar when building the three-dimensional article by fusing the powder layer by layer with the energy beam.

The powder hoppers 306, 307 comprise the powder material to be provided on the start plate 316 in the build tank 312. The powder material may for instance be pure metals or metal alloys such as titanium, titanium alloys, aluminum, aluminum alloys, stainless steel, Co—Cr—W alloy, etc.

The powder distributor 310 is arranged to lay down a thin layer of the powder material on the start plate 316. During a work cycle the build platform 314 will be lowered successively in relation to the ray gun after each added layer of powder material. In order to make this movement possible, the build platform 314 is in one embodiment of the invention arranged movably in vertical direction, i.e., in the direction indicated by arrow P. This means that the build platform 314 starts in an initial position, in which a first powder material layer of necessary thickness has been laid down on the start plate 316. The build platform is thereafter lowered in connection with laying down a new powder material layer for the formation of a new cross section of a three-dimensional article. Means for lowering the build platform 314 may for instance be through a servo engine equipped with a gear, adjusting screws etc.

The three-dimensional article which is formed through successive fusion of parts of a powder bed, which parts corresponds to successive cross sections of the three-dimensional article, comprising a step of providing a model of the three dimensional article. The model may be generated via a CAD (Computer Aided Design) tool.

A first powder layer may be provided on the work table 316 by distributing powder evenly over the worktable according to several methods. One way to distribute the powder is to collect material fallen down from the hopper 306, 307 by a rake system. The rake is moved over the build tank thereby distributing the powder over the start plate. The distance between a lower part of the rake and the upper part of the start plate or previous powder layer determines the thickness of powder distributed over the start plate. The powder layer thickness can easily be adjusted by adjusting the height of the build platform 314.

An energy beam is directed over the work table 316 causing the first powder layer to fuse in selected locations to form a first cross section of the three-dimensional article. The energy beam may be an electron beam or a laser beam. The beam is directed over the work table 316 from instructions given by a control unit (not shown). In the control unit instructions for how to control the beam gun for each layer of the three-dimensional article is stored.

After a first layer is finished, i.e., the fusion of powder material for making a first layer of the three-dimensional article, a second powder layer is provided on the work table 316. The second powder layer is preferably distributed according to the same manner as the previous layer. A powder distributor in the form of a single rake system, i.e., where one rake is catching powder fallen down from both a left powder hopper 306 and a right powder hopper 307, the rake as such can change design.

After having distributed the second powder layer on the work table 316, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

After having fused selected portions of the first powder layer, at least one first image is captured of at least a first fusion zone of the first powder layer.

Figure 1A:
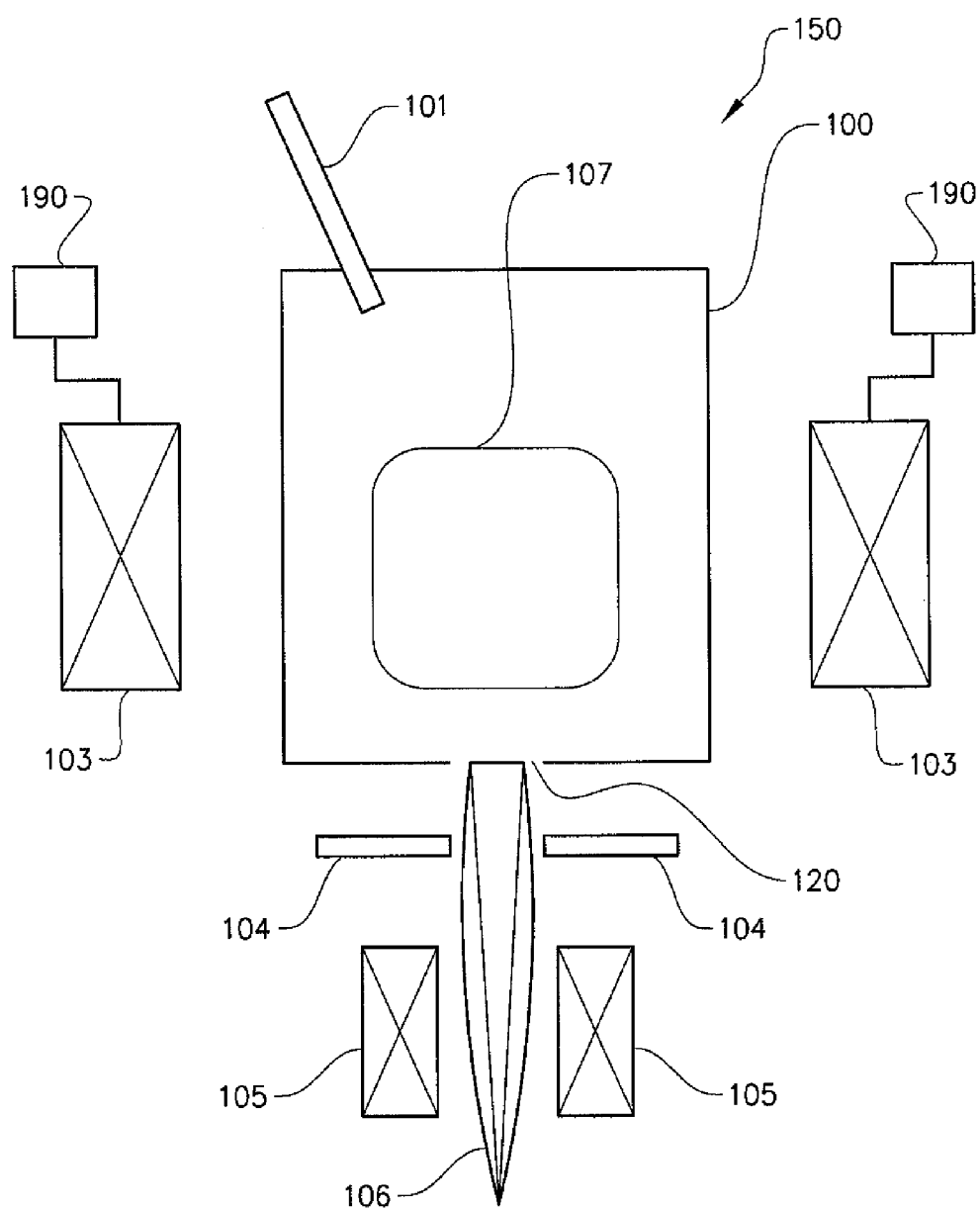
FIG. 1A depicts a first example embodiment of a plasma electron source apparatus according to the present invention.

FIG. 1A depicts a first exemplary embodiment of a plasma electron source apparatus 150 according to the present invention. The plasma electron source apparatus 150 comprises a cathode discharge chamber 100, an optional gas inlet 101, an exit hole 120, an electromagnetic coil 103, an anode 105, and optional beam shaping optics 105.

The cathode discharge chamber 100 is provided with a gas inlet 101 for introducing gas into the cathode discharge chamber. The gas may for instance be Argon, Helium, Neon or Krypton. Gas introduced into the cathode discharge chamber 100 will leak through the exit hole 120. The exit hole 120 is provided for extracting electrons from a plasma 107 provided in the cathode discharge chamber 100.

Figure 1B:
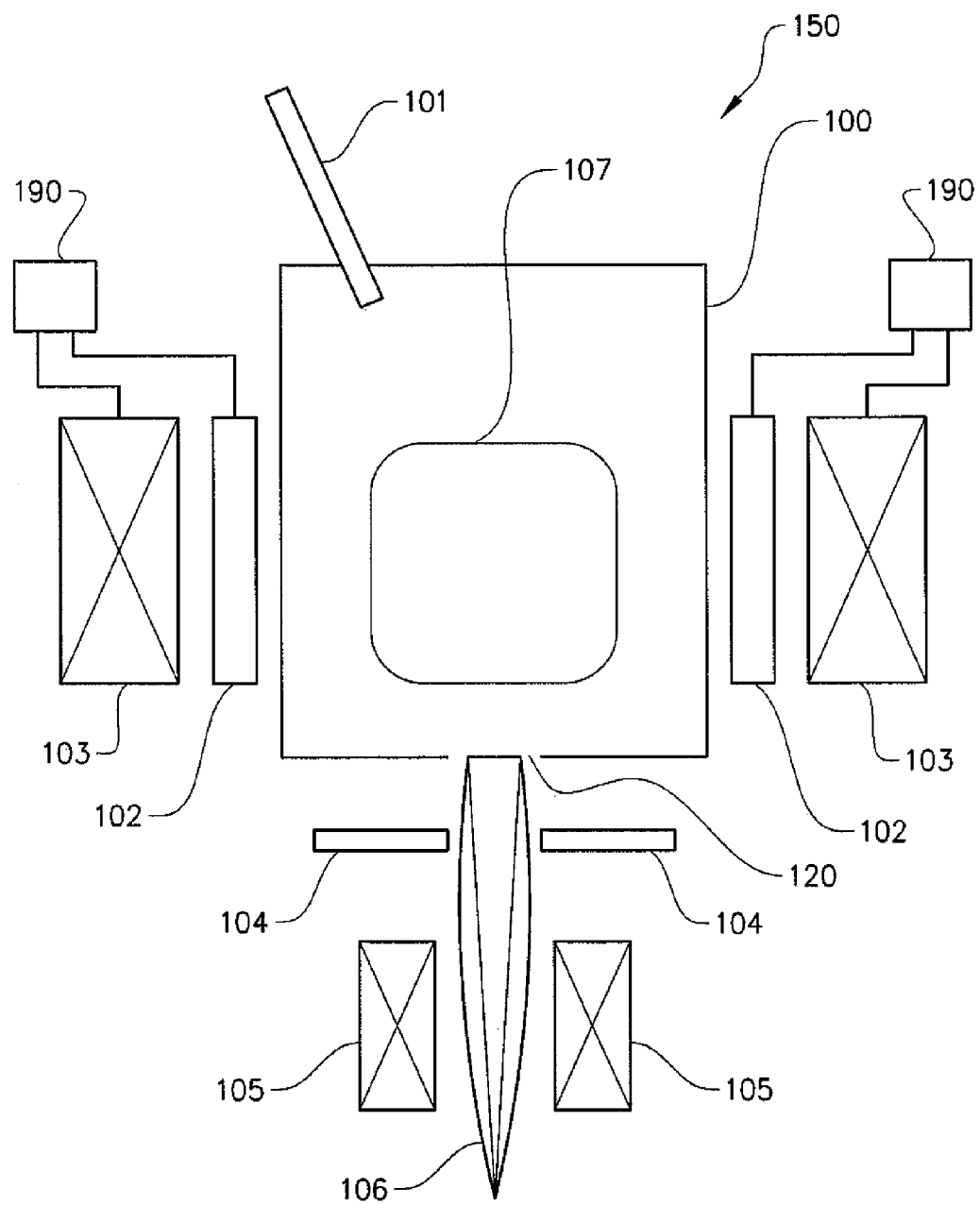
FIG. 1B depicts a second example embodiment of a plasma electron source apparatus according to the present invention.

In another example embodiment depicted in FIG. 1B the plasma is generated by an RF source 102 provided on the outside of the cathode discharge chamber 100. The RF source 102 may be a coil into which an RF signal is introduced. The frequency of a RF power may be 10-15 MHz. The RF power from the coil will generate an RF induction discharge of the gas in the cathode discharge chamber 100 thereby creating the plasma 107 comprising electrons and ions. The RF power may be in the range of 50-500 Watt.

Figure 1C:
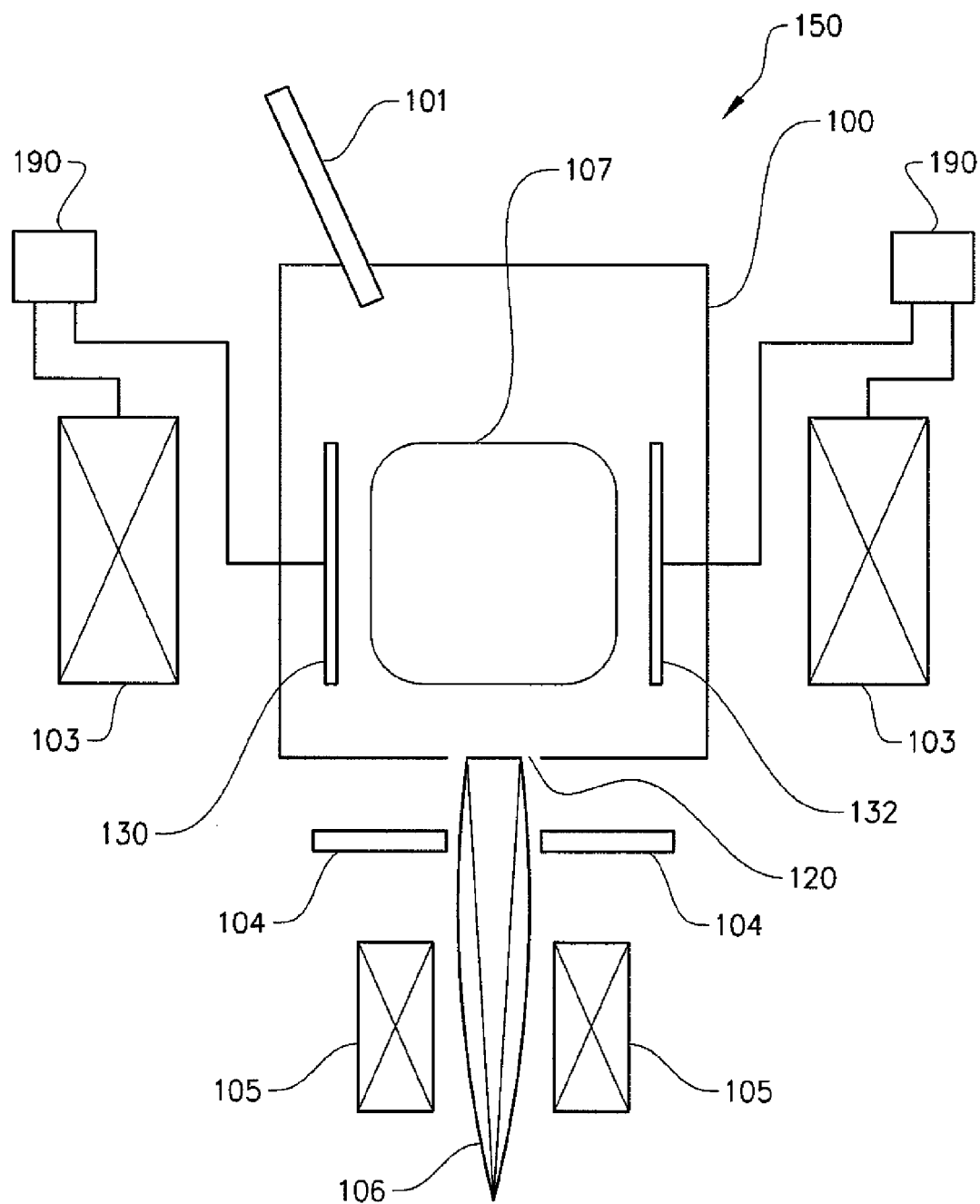
FIG. 1C depicts a third example embodiment of a plasma electron source apparatus according to the present invention.

In an alternative embodiment according to FIG. 1C the plasma 107 is generated by a filament discharge, i.e., an anode 130 and cathode 132 arranged inside the cathode discharge chamber 100 provided with a sufficiently high voltage for creating the plasma 107 with ions and electrons instead of the RF source 102 as depicted in FIG. 1B.

There are other various ways of generating plasma, for instance by means of microwaves acting on the gas inside the cathode discharge chamber. The hollow cathode discharge technique is another way. Dielectric barrier discharge is still another way of creating the plasma within the cathode discharge chamber. Indeed, although certain techniques and/or means may be described herein, any of a variety of suitable techniques for generating the plasma may be used in this context, without departing from the scope and nature of the present invention.

The electromagnetic coil 103 may be provided so that a plasma confinement within the cathode discharge chamber 100 is produced. In the example embodiment in FIG. 1B, the electromagnetic coil 103 may provided outside the RF coil 102. In an alternative embodiment the electromagnetic coil 103 may be provided between the cathode discharge chamber 100 and the RF-coil 102 (not illustrated). In still another embodiment the electromagnetic coil 103 may be provided inside the cathode discharge chamber 100 (not illustrated). The magnetic field intensity inside the cathode discharge chamber 100 generated by the electromagnetic coil 103 may be in the range 10-300 gauss for generating the plasma confinement. The plasma confinement may be used for extracting electrons from the cathode discharge chamber 100 at a relatively low gas pressure and for increasing the electron extraction efficiency. If the field intensity inside the cathode discharge chamber 100 is below a predetermined value generated by a predetermined current through the electromagnetic coil 103, not enough electrons may be extracted from the exit hole 120 to form an electron beam 106. However, if the field intensity is above a predetermined value inside the cathode discharge chamber 100 a suitable plasma confinement may be generated and electrons may be extracted from the exit hole 120 to form an electron beam 106. The field intensity inside the cathode discharge chamber 100 when no electron beam may be formed may be 0 or essentially 0 field intensity. The field intensity in which a constant and reliable electron beam may be extracted from the cathode discharge chamber may very much be dependent on the size and dimensions of the chamber 100 and the gas pressure in the cathode discharge chamber. A cylindrical chamber with a diameter of 15 cm may need a field intensity above 10 gauss inside the chamber for extracting electrons from the exit hole 120. Larger diameters may need larger field intensity for extracting electrons with constant gas pressure. The gas pressure inside the cathode discharge chamber 100 may be in the range of $10^{-4}$-$10^0$ mbar.

The radio frequency used for plasma confinement in the electromagnetic coil 103 may be between 2-80 GHz. The frequency of the RF source or microwave source may be set to the resonance frequency of the gas inside the cathode discharge chamber 100 and/or the size and shape of the cathode discharge chamber, i.e., the resonance frequency of the chamber.

The plasma 107 may be arranged in the middle of the cathode discharge chamber 100. In an example embodiment there may be provided a distance between the exit hole and the plasma inside the cathode discharge chamber being 3-4 times the diameter of the exit hole.

A pulsed electron beam may be generated by switching on and off the field intensity inside the cathode discharge chamber, i.e., by switching on and off the current through the coil 103. Switching the current from a first value being essentially 0 and a second value for creating sufficient field intensity inside the cathode discharge chamber 100 may therefore be used for generating a pulsed electron beam. The frequency of the switching may be higher than 100 Hz, 1 kHz or 100 kHz. Switching means for making the switching of the current in the coil 103 may be accomplished by using a high frequency electronic circuit as a driver for the coil current, which is well known to a skilled person in the art.

Also the operation of the source is more stable when the switching of the electron beam is performed using the confinement coil 103 rather than switching the plasma generating circuit, as this would mean that the plasma would have to be recreated for each pulse cycle.

An anode may be provided outside the cathode discharge chamber 100 in the vicinity of the exit hole. A voltage is applied between the cathode discharge chamber and the anode, typically the potential provided on the cathode discharge chamber is −60 kV and the potential provided on the anode is at ground potential. By this arrangement electrons will be accelerated in the accelerating field between the cathode discharge chamber 100 and the anode 104. Reversing the potential difference will extract positive ions instead of negative electrons from the cathode discharge chamber.

Optional beam shaping optics may be arranged downstream of the anode for shaping, scanning and/or focusing the electron beam.

Figure 2:
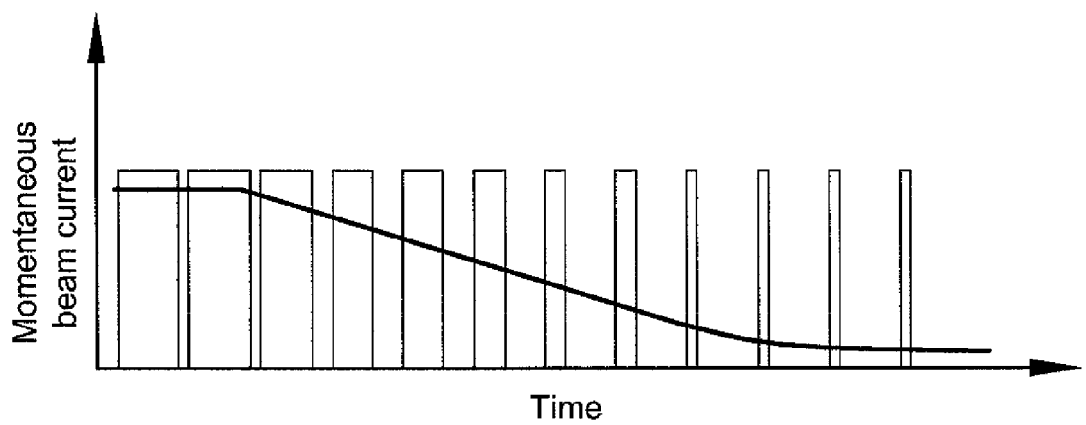
FIG. 2 depicts an example embodiment of operation of the inventive plasma electron source apparatus with variable duty cycle to control the average electron beam current.

FIG. 2 illustrates an example embodiment of variable duty cycle to control the average electron beam current by means of pulse width modulation. Higher switching duty cycle (illustrated to the left in FIG. 2) will create a higher average electron beam current compared to a lower switching duty cycle (illustrated to the right in FIG. 2). Changing the on/off switching duty cycle of the current in the coil 103 will affect the average electron beam current which is extracted from the cathode discharge chamber 100.

This may be useful in additive manufacturing when the electron beam source is a plasma source. The melting power may be changed instantaneously by changing the pulse duty cycle up or down depending on what is needed. A rapid control of melt power may result in better produced articles with respect to surface finish, microstructures and/or mechanical properties.

With the above mentioned generation of an electron beam it is far easier to make a high quality electron beam (non-varying electron beam intensity over time). Since the plasma inside the cathode discharge chamber is not switched on and off, influences of switching on and off the plasma on the electron beam quality has been eliminated. The variance of electron beam current is more or less constant. The average beam current may be alternated by changing the duty cycle of switching on/off the current in the coil 103.

Figure 4A:
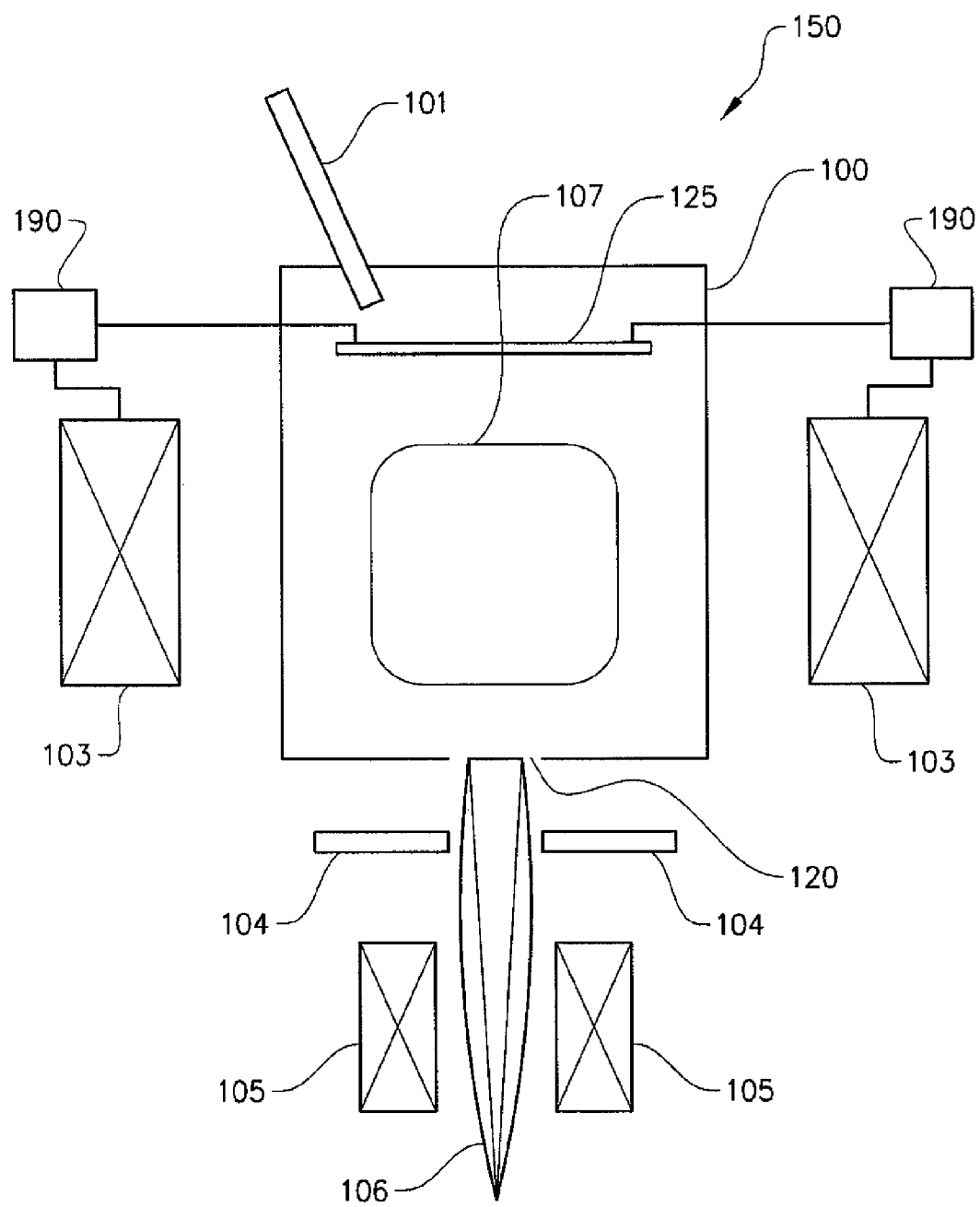
FIG. 4A depicts a fourth example embodiment of a plasma electron source apparatus according to the present invention.

FIG. 4A depicts a fourth non-limiting exemplary embodiment of a plasma electron source apparatus according to the present invention. The only difference of the fourth example embodiment to the first example embodiment as illustrated in FIG. 1A is an additional electron beam controlling plate 125.

The electron beam controlling plate 125 may be set to a positive or negative potential with respect to the cathode discharge chamber 100. The potential provided on the electron beam controlling plate 125 may be in the range of $\alpha \pm \in$ kV, where a is the potential provided on the cathode discharge chamber and $\in$ is a potential difference with respect to the cathode discharge chamber 100. $\alpha$ may be in the range of 10-100 kV and $\in$ in the range of 10-1000V. In an example embodiment where $\in$ is −50V the electrons in the plasma inside the cathode discharge chamber will be forced towards the exit hole 120. An electromagnetic coil 103 which is switched on cooperates with an electron beam controlling plate having an $\in$ which is negative, i.e., more electron are forced through the exit hole 103 enabling higher electron beam current.

In another example embodiment where $\in$ is +50V the electrons in the plasma inside the cathode discharge chamber will be forced towards the electron beam controlling plate 125. An electromagnetic coil 103 which is switched off cooperates with an electron beam controlling plate having an $\in$ which is positive, i.e., electron are prohibited from being extracted through the exit hole 103.

Figure 4B:
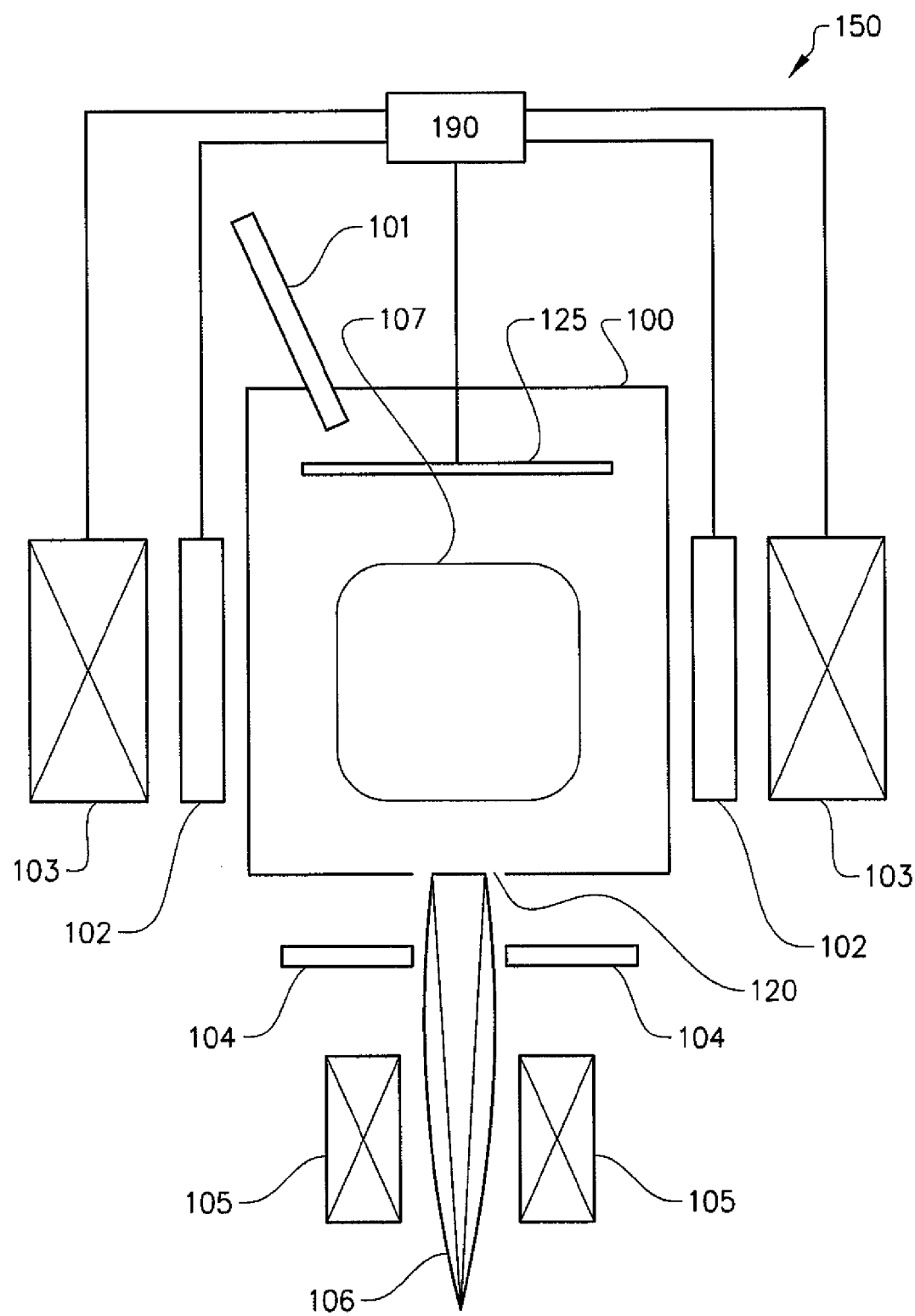
FIG. 4B depicts a fifth example embodiment of a plasma electron source apparatus according to the present invention.

FIG. 4B depicts a fifth example embodiment of a plasma electron source apparatus according to the present invention. The only difference of the fifth example embodiment relative to the second example embodiment as illustrated in FIG. 1B is an additional electron beam controlling plate 125.

Figure 4C:
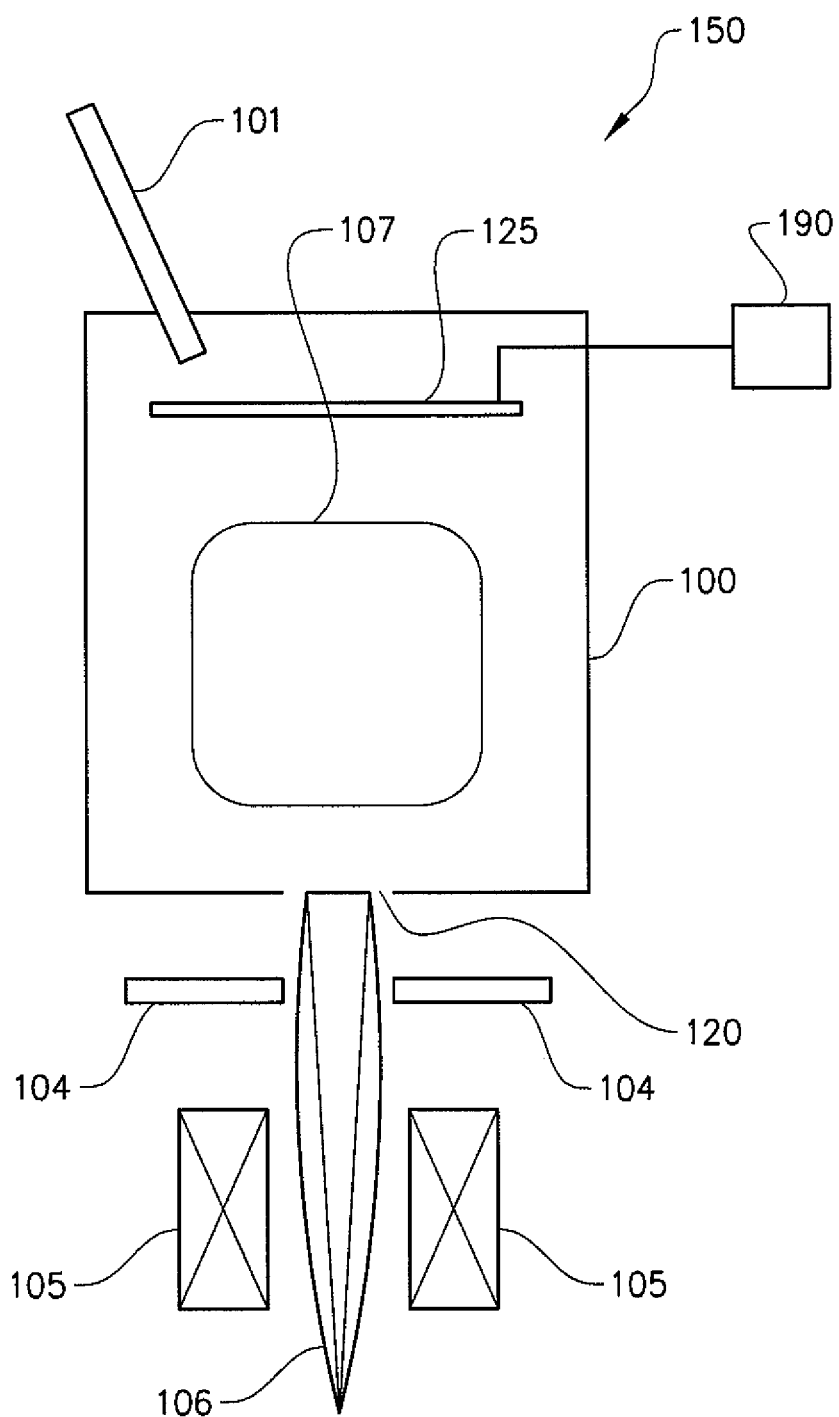
FIG. 4C depicts a sixth example embodiment of a plasma electron source apparatus according to the present invention.

In still another exemplary embodiment the coil 103 may be completely replaced by the electron beam controlling plate 125, as may be seen in the sixth example embodiment of the present invention depicted in FIG. 4C. Extraction of electrons from the exit hole 103 is in this embodiment only dependent on the potential of the electron beam controlling plate 125. When $\in$ is negative electrons in the plasma are forced to the exit hole. When $\in$ is positive electrons in the plasma are prohibited from being extracted through the exit hole.

It may also be that the overall charge state of the plasma is positive due to more ions than electrons in the plasma. The electric force from the plate 125 acting on the electrons may be screened by the ions. In such case the plasma is pushed towards the exit hole 129 by a positive voltage.

Having only the electron beam controlling plate, i.e., no coil 103, for switching on and off the electron beam, the $\in$ may need to be in the range of 100-10 000V.

Figure 5:
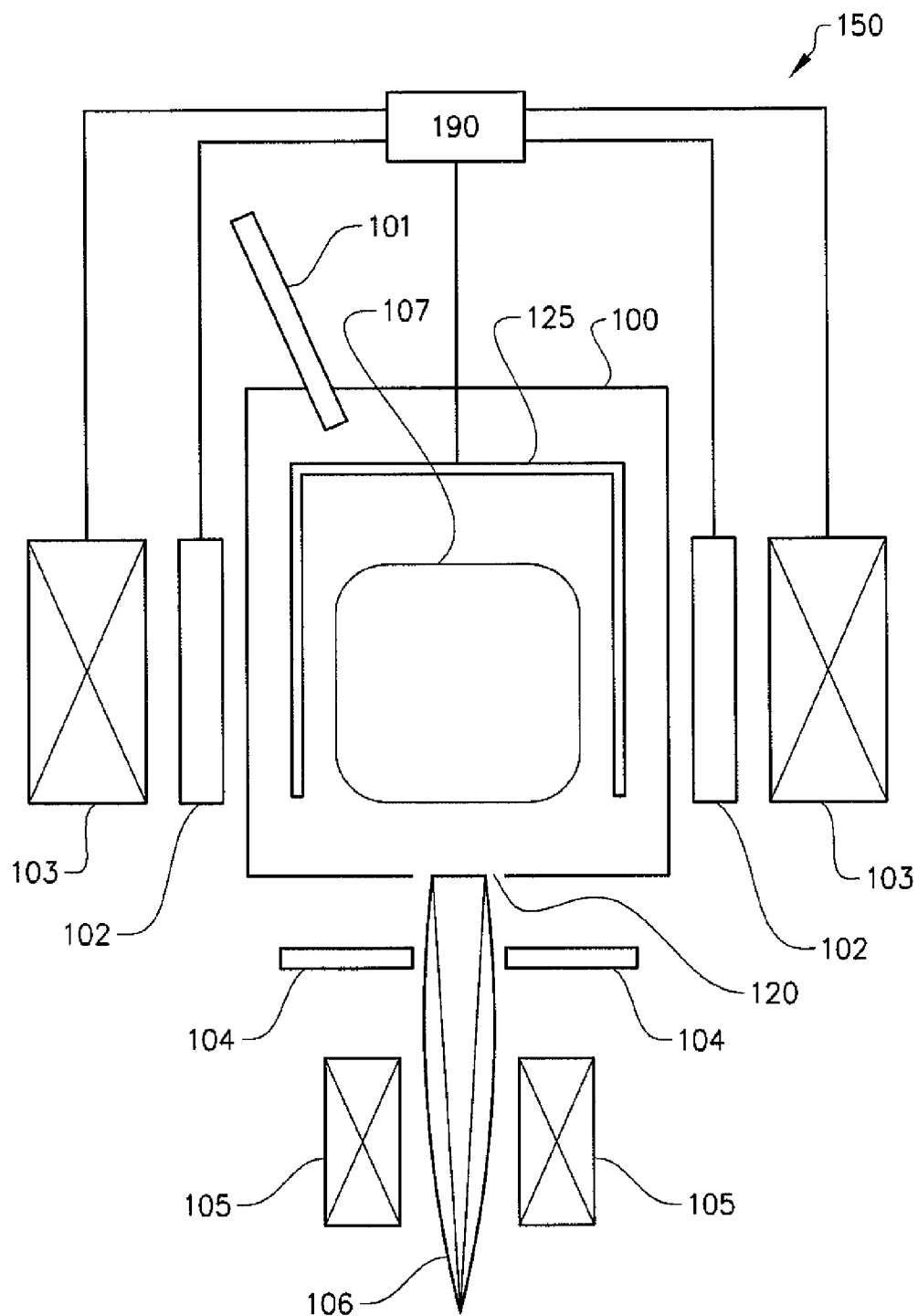
FIG. 5 depicts a seventh example embodiment of a plasma electron source apparatus according to the present invention.

While in certain embodiments the electron beam controlling plate 125 may be substantially planar, in an alternative embodiment as depicted in FIG. 5 the electron beam controlling plate 125 may be non-flat to provide not only a field pushing the electrons downwards towards the exit hole 120, but also pushing the electrons towards the center axis of the cathode discharge chamber 100. The non-flat controlling plate 125 may also be used in the embodiment as depicted in FIGS. 4A and/or 4B. In still another example embodiment of the present invention the controlling plate may be a ring with its opening in the direction of the exit hole 120. By using the ring shaped controlling plate the plasma may both be concentrated within the ring and moved to or from the hole depending on the potential on the ring, a negative potential will force the plasma towards the exit hole 120 and a positive potential will force the plasma from the exit hole 120. It could also be reversed for the same reason as indicated above, i.e., it depends on the momentary overall charge state of the plasma.

Fast switching may also be useful for switching off the beam in additive manufacturing when the beam is scanned from a first position to a second position. The beam is switched on when the beam is in its correct melting or heating position. This will result in no incorrect melting or heating, i.e., the melting will only take place at predetermined positions. For instance, no heating of the powder may take place while scanning the electron beam over the powder material since the electron beam may be switched off during electron beam scanning.

In an example embodiment of additive manufacturing for forming a three dimensional article through successive fusion of parts of at least one layer of a powder bed provided on a work table, which parts correspond to successive cross sections of the three-dimensional article, a plasma electron gun is used for fusing the powder material. Electron beam generation is switched off during scanning of the electron beam, i.e., while changing the settings of a scanning coil provided downstream an exit hole of a cathode discharge chamber of the plasma electron gun.

In still another example embodiment of additive manufacturing for forming a three dimensional article through successive fusion of parts of at least one layer of a powder bed provided on a work table, which parts correspond to successive cross sections of the three-dimensional article, a plasma electron gun is used for fusing the powder material. An average beam current is alternated by changing the duty cycle of switching on/off the current in the coil 103.

In yet another example embodiment of the present invention, the current provided to the coil 103 may be changed for changing the number of electrons extracted from the exit hole 120. Varying the current in coil 103 may change the number of electrons extracted from the exit hole 120. An increase in current through the coil 103 typically increases the number of electrons extracted through the exit hole 120. Decreasing the current through the coil 103 typically decreases the number of electrons extracted through the exit hole 120. An analog variation of the current through the coil 103 may rapidly change the number of electrons being emitted from the exit hole 120. In similar fashion this also applies to the electron beam controlling plate, i.e., a variation of the potential applied to the electron beam controlling plate 125 may affect the number of electrons emitted from the exit hole 120. As in the examples given above the current may be varied in the coil 103 only or the potential may be changed to the electron beam controlling plate 125 only or the current may be varied in the coil 103 and the potential may be changed to the electron beam controlling plate 125 only simultaneously for varying the number of emitted electrons from the exit hole 120.

In an alternative embodiment the current through the coil is varied simultaneously as the current through the coil is switched on and off to produce a pulsed electron beam, i.e., each pulse of the electron beam may comprise different number of electrons due to a different amount of current through the coil 103. This also applies to the electron beam controlling plate, i.e., the potential can be varied simultaneously as the potential is switched on and off, meaning that two consecutive on switching of the potential may be of different values for effecting the number of electrons emitting through the exit hole 120. The combination of varying the potential of the electron beam controlling plate and changing the current through the coil 103 as both the coil and the electron beam controlling plate are switched on and off is also possible.

The switching means for switching at least one means for plasma confinement between a first value allowing for electron extraction from the plasma 107 and a second value prohibiting electron extraction from the plasma 107 may be a computer controlled signal generator 190. The signal generator may be a power supply, a current supply, a voltage supply and/or a frequency supplier.

The invention is not limited to the above-described embodiments and many modifications are possible within the scope of the following claims. Such modifications may, for example, involve using a different source of energy beam than the exemplified electron beam such as laser beam. Other materials than metallic powder may be used, such as powder of polymers or powder of ceramics. Indeed, a person of ordinary skill in the art would be able to use the information contained in the preceding text to modify various embodiments of the invention in ways that are not literally described, but are nevertheless encompassed by the attached claims, for they accomplish substantially the same functions to reach substantially the same results. Therefore, it is to be under- That which is claimed:

1. A plasma electron source apparatus comprising:
 a cathode discharge chamber in which a plasma is generated;
 an exit hole provided in said cathode discharge chamber from which electrons from the plasma are extracted by an accelerating field provided between said cathode discharge chamber and an anode;
 at least one plasma confinement device; and
 a switching mechanism for switching the at least one plasma confinement device between a first value allowing for electron extraction from the plasma and a second value prohibiting electron extraction from the plasma, wherein:
  said plasma confinement device is at least one electromagnetic wave generator and said switching mechanism for regulating a confinement force between said first and said second values is at least one of a wavelength generated by an electromagnetic wave source or an amplitude of an electromagnetic wave generated by the source; and
  said switching mechanism is configured to switch at least one of a frequency or an amplitude of said electromagnetic wave generator.

2. The apparatus according to claim 1, wherein said plasma confinement device is selected from the group consisting of: at least one electromagnetic coil, at least one electromagnetic wave generator, at least one beam controlling plate, and any combination thereof.

3. The apparatus according to claim 2, wherein said plasma confinement device is at least one electromagnetic wave generator configured to emit at least one of RF power and microwave power so as to act on said gas inside said cathode discharge chamber for producing said plasma.

4. The apparatus according to claim 1, wherein said plasma confinement device is arranged outside the cathode discharge chamber.

5. The apparatus according to claim 1, wherein said plasma confinement device is arranged inside the cathode discharge chamber.

6. The apparatus according to claim 1, wherein the at least one plasma confinement device comprises at least one electromagnetic coil and at least one electron beam controlling plate.

7. The apparatus according to claim 6, wherein the at least one electron beam controlling plate is provided inside the cathode discharge chamber and arranged so that at least a part of the plasma is provided between said electron beam controlling plate and said exit hole.

8. The apparatus according to claim 7, wherein said at least one electron beam controlling plate is curved.

9. The apparatus according to claim 7, wherein said at least one electron beam controlling plate is an annular structure having an opening passing through a center portion thereof, said opening being directed substantially toward said exit hole.

10. The apparatus according to claim 1, wherein said plasma confinement device is at least one electron beam controlling plate (125) provided inside the cathode discharge chamber (100) and arranged so that at least a part of the plasma is provided between said electron beam controlling plate (125) and said exit hole (120).

11. The apparatus according to claim 1, wherein said plasma confinement device is at least one electromagnetic coil and said switching mechanism for regulating a confinement force between said first and said second values is a current passing through said at least one electromagnetic coil.

12. The apparatus according to claim 1, wherein said electromagnetic wave source is located outside said cathode discharge chamber.

13. The apparatus according to claim 1, wherein said plasma confinement device is at least one electron beam controlling plate and said switching mechanism for regulating a confinement force between said first and said second values is a voltage applied on said plate.

14. The apparatus according to claim 1, further comprising a control unit for varying the duty cycle of the at least one means for plasma confinement for varying the average electron current from the plasma electron source.

15. The apparatus according to claim 1, wherein said cathode discharge chamber is provided with an inlet connectable to a gas source for introducing gas into the cathode discharge chamber.

16. The apparatus according to claim 1, wherein a frequency of switching between said first and second current values is higher than at least one of 100 Hz, 1 kHz, and 100 kHz.

17. Use of a plasma electron source apparatus according to claim 1 for forming a three dimensional article through successive fusion of parts of at least one layer of a powder bed provided on a work table, which parts correspond to successive cross sections of the three-dimensional article.

18. A method for generating a pulsed electron beam comprising the steps of:
 generating a plasma in a cathode discharge chamber;
 extracting electrons from an exit hole in said cathode discharge chamber by an accelerated field provided between said cathode discharge chamber and an anode;
 providing at least one plasma confinement device, said at least one plasma confinement device being at least one electromagnetic wave generator; and
 switching the at least one plasma confinement device between a first value allowing for electron extraction from the plasma and a second value prohibiting electron extraction from the plasma, said switching occurring via a switching mechanism that is at least one of a wavelength generated by an electromagnetic wave source or an amplitude of an electromagnetic wave generated by the source, said switching comprising switching of at least one of a frequency or said amplitude of said electromagnetic wave generator.

19. The method of claim 18, wherein said at least one plasma confinement device is selected from the group consisting of: at least one electromagnetic coil, at least one frequency generator, at least one beam controlling plate, and any combination thereof.

20. The method of claim 18, wherein said at least one plasma confinement device is positioned inside the cathode discharge chamber (100).

21. The method of claim 18, wherein said at least one plasma confinement device is positioned outside the cathode discharge chamber (100).

22. The method of claim 18 further comprising the step of varying a duty cycle of the switching between said first and second values for controlling the average electron current from the plasma electron source.

23. The method of claim 18, further comprising the step of generating said plasma within said cathode discharge chamber by an RF field acting on a gas being present inside the cathode discharge chamber.

24. The method of claim 18, further comprising the step of providing an inlet to said cathode discharge chamber connectable to a gas source for introducing a gas into the cathode discharge chamber.

25. The method of claim 18, further comprising the step of providing an electron beam controlling plate inside the cathode discharge chamber arranged so that at least a part of the plasma is provided between said electron beam controlling plate and said exit hole.

26. The method of claim 18, further comprising the step of varying the current through said coil for varying the number of electrons being emitted through the exit hole.

27. The method of claim 18, further comprising the step of varying the potential applied to said electron beam controlling plate for varying the number of electrons being emitted through the exit hole (120).

28. The method of claim 18, further comprising the step of at least one of switching the current through said coil, switching a voltage of said beam controlling plate, and switching a frequency or amplitude of said electromagnetic wave generator between said first and second value for switching on and off electron beam generation.

\* \* \* \* \*